United States Patent
Kudo et al.

(10) Patent No.: US 7,940,485 B2
(45) Date of Patent: May 10, 2011

(54) MAGNETIC RECORDING AND REPRODUCING APPARATUS HAVING A MAGNETIC READ HEAD WITH A SPIN-TORQUE OSCILLATOR

(75) Inventors: Kiwamu Kudo, Kamakura (JP); Koichi Mizushima, Kamakura (JP); Tazumi Nagasawa, Yokohama (JP); Rie Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/549,125

(22) Filed: Aug. 27, 2009

(65) Prior Publication Data

US 2010/0053795 A1    Mar. 4, 2010

(30) Foreign Application Priority Data

Aug. 29, 2008    (JP) ................ 2008-222294

(51) Int. Cl.
*G11B 5/02* (2006.01)
*G11B 5/127* (2006.01)
*G11B 21/02* (2006.01)
*G11B 15/46* (2006.01)

(52) U.S. Cl. ............ 360/55; 360/110; 360/313; 360/75; 360/73.03

(58) Field of Classification Search .................. None
See application file for complete search history.

(56) References Cited

U.S. PATENT DOCUMENTS

| 7,791,829 B2* | 9/2010 | Takeo et al. ............... 360/55 |
| 2006/0222835 A1 | 10/2006 | Kudo et al. ................ 428/212 |
| 2008/0304176 A1* | 12/2008 | Takagishi et al. ............. 360/86 |
| 2009/0086354 A1 | 4/2009 | Sato et al. .................. 360/30 |
| 2010/0232053 A1* | 9/2010 | Yano et al. .................. 360/75 |

FOREIGN PATENT DOCUMENTS

| JP | 2006-286855 | 10/2006 |
| JP | 2009-080891 A | 4/2009 |

OTHER PUBLICATIONS

Nikkei Electronics, Nov. 19, 2007, pp. 89-94 with Statement of Relevance as described in the specification at p. 2.

* cited by examiner

*Primary Examiner* — Andrew L Sniezek
(74) *Attorney, Agent, or Firm* — Ohlandt, Greeley, Ruggiero & Perle, L.L.P.

(57) ABSTRACT

A magnetic recording and reproducing apparatus includes a magnetic head that has a spin-torque oscillator and a magnetic disk and the spin-torque oscillator detects a magnetic field from the magnetic disk and outputs a signal. A criterion used to determine the rotational speed of the magnetic disk, the frequency shift of the spin-torque oscillator produced by a magnetic field from the magnetic disk, a characteristic oscillation frequency of the spin-torque oscillator and the full-width at half maximum of an oscillation spectrum is given in order for a read signal output from the spin-torque oscillator to satisfy a desired signal-to-noise ratio and a magnetic recording and reproducing apparatus is configured based on the criterion.

7 Claims, 7 Drawing Sheets

F I G. 1

F I G. 2

F I G. 3

F I G. 4

F I G. 5

F I G. 6

F I G. 7

F I G. 8

F I G. 9

F I G. 10

F I G. 11

F I G. 12

F I G. 13

ND REPRODUCING APPARATUS HAVING A MAGNETIC READ HEAD WITH A SPIN-TORQUE OSCILLATOR

MAGNETIC RECORDING AND REPRODUCING APPARATUS HAVING A MAGNETIC READ HEAD WITH A SPIN-TORQUE OSCILLATOR

CROSS-REFERENCE TO RELATED APPLICATIONS

This application is based upon and claims the benefit of priority from prior Japanese Patent Application No. 2008-222294, filed Aug. 29, 2008, the entire contents of which are incorporated herein by reference.

BACKGROUND OF THE INVENTION

1. Field of the Invention

This invention relates to a magnetic recording and reproducing apparatus having a high signal-to-noise ratio and capable of performing a recorded data reading operation at high speed.

2. Description of the Related Art

First, the known technical idea of a hard disk drive (HDD) composed of a bit-patterned medium and a spin-torque oscillator is described below. A bit-patterned medium is one type of magnetic disk of a constant density recording (CDR) system. The spin-torque oscillator is used as a magnetic read head. The recorded data is read by detecting a frequency modulation of the spin-torque oscillator. This HDD is a desirable technical concept as an HDD having high performance such as a recording density of 1 Tbit/inch$^2$ or more and a read speed of 1 Gbit/s or more.

It is predicted that the recording density of the HDD will reach 1 Tbit/inch$^2$ by 2012. In order to achieve the high recording density, a discrete track medium is provided in which a non-magnetic layer is embedded between respective tracks of a magnetic disk to reduce the magnetic influence of the adjacent track as is disclosed in Nikkei Electronics Nov. 19, 2007, pp 89-94. However, it is considered that a problem of thermal fluctuation can not be solved by the discrete track medium if the recording density becomes 1 Tbit/inch$^2$ or more. As the next-generation medium technology for solving the above problem, much attention is paid to a bit-patterned medium. The bit-patterned medium is a magnetic recording medium in which minute magnetic dots are regularly arranged on the disk surface and '0' or '1' is written to each magnetic dot and thus the high recording density can be attained while suppressing occurrence of thermal fluctuation. Therefore, the bit-patterned medium is considered as a desirable future recording medium. The bit-patterned medium can be regarded as one type of the CDR magnetic disk which has the same recording density in the inner and outer peripheral portion.

As the recording density is increased to 1 Tbit/inch$^2$ or more, it is necessary to further increase the sensitivity of the magnetic read head. In order to increase the sensitivity, CPP-GMR or TMR devices with high magnetoresistive (MR) ratio are actively studied. As the MR device that has received much attention in recent years, there is a MgO-based TMR device. In the magnetic head using a CPP-GMR or TMR device, the magnetization direction of the free magnetic layer is rotated according to the magnetic field from the magnetic recording medium and makes a relative angle with the magnetization direction of the fixed magnetic layer. Then, via the MR effect, the device resistance varies depending on the relative angle of the two magnetizations. In the magnetic head using a CPP-GMR or TMR device, magnetic recorded data is read by the detection of the resistance variation or voltage variation based on the MR effect. One of the noise sources in the process of reading data is thermal fluctuation of the magnetization of the free layer. The noise due to the thermal fluctuation cannot be basically solved by increasing the MR ratio of the device because the noise level is increased as the MR ratio is increased. Therefore, a new magnetic head technology is desired. In JP-A 2006-286855 (KOKAI), a magnetic head having a spin-torque oscillator is disclosed as means for solving a problem of thermal fluctuation of the magnetization of the free magnetic layer in the magnetic head. The basic structure of the spin-torque oscillator is similar to the CPP-GMR or TMR device and contains at least one free magnetic layer. In the spin-torque oscillator, the magnetization of the free magnetic layer steadily oscillates when a current with the current density of approximately 10$^7$ A/cm$^2$ is passed through the device. Then, oscillation voltage corresponding to oscillation of magnetization is emitted from the device via the MR effect. In the spin-torque oscillator, the magnitude of fluctuation of the free layer magnetization decreases since the thermally fluctuated magnetization is forcedly subjected to steady oscillation. Therefore, the thermal fluctuation of the free layer magnetization that is a noise source in the magnetic read head using a CPP-GMR or TMR device is greatly suppressed in the magnetic read head using the spin-torque oscillator.

There are two systems of the magnetic read head using the spin-torque oscillator: an amplitude reading system and frequency reading system. In the amplitude reading system, the amplitude variation of oscillation voltage emitted from the spin-torque oscillator is used. Magnetic recorded data on the medium is obtained by detecting the amplitude variation. On the other hand, in the frequency reading system, a phenomenon that the oscillation frequency of the spin-torque oscillator changes according to the magnetic field from the magnetic recording medium is utilized. Magnetic recorded data on the medium is obtained by detecting the oscillation frequency variation. According to the above classification of the systems of a magnetic read head, the system used in the conventional magnetic head using a CPP-GMR or TMR device is classified as the amplitude reading system.

If the amplitude reading system and frequency reading system in the magnetic read head using a spin-torque oscillator are compared with each other, the latter system is more suitable for high-speed reading than the former system as is proposed in Japanese Patent Application No. 2007-249650 filed Sep. 26, 2007. The read speed in the amplitude reading system is physically limited by relaxation time of the free layer magnetization. The relaxation ratio of the free layer magnetization is roughly estimated as follows:

$$\frac{180°}{\Delta\theta} \times \frac{\alpha\gamma H_{\mathit{eff}}}{2\pi} \left[\frac{1}{\sec}\right]$$

where $\Delta\theta$ [degrees] indicates a rotational angle of the free layer magnetization by a magnetic field from the magnetic recording medium, $\alpha$ a Gilbert damping constant, $\gamma$ a gyromagnetic ratio and $H_{\mathit{eff}}$ an effective magnetic field steadily sensed by the free layer magnetization. If $\Delta\theta=5°$, $\alpha=0.01$, $\gamma=1.76\times10^7$ [1/Oe·s] and $H_{\mathit{eff}}=1000$ Oe, the relaxation ratio can be estimated as approximately 1 GHz. That is, the limit of the read speed of the amplitude reading system is approximately 1 Gbit/s. In the frequency reading system, the read speed is not limited by the relaxation time of magnetization. Therefore, the read speed of the magnetic head of the frequency reading system using the spin-torque oscillator is expected to have a better performance than that of the existing magnetic head.

As described above, the bit-patterned medium and the magnetic read head of the frequency-change detection system using the spin-torque oscillator respectively have advantages, and an HDD with both of them can have high performance in the form of a recording density of 1 Tbit/inch$^2$ or more and a read speed of 1 Gbit/s or more.

However, in an HDD with the magnetic read head of the frequency-change detection system using the spin-torque oscillator, a problem that does not appear in the existing magnetic head is revealed. There occurs a problem of phase noise of the oscillation voltage resulting in the reduction of the signal-to-noise (SN) ratio. In the magnetic head of the frequency-change detection system using the spin-torque oscillator, the thermal fluctuation of magnetization is largely suppressed in comparison with the existing magnetic head. However, slight magnetization fluctuation remains and appears as phase noise of oscillation voltage. A read signal output is degraded by the phase noise. In the HDD having the bit-patterned medium and the magnetic head of the frequency-change detection system using the spin-torque oscillator, it is required to output a read signal at a high signal-to-noise ratio and output a signal with reduced noise even if phase noise is present.

As described above, in the magnetic recording and reproducing apparatus having the magnetic read head of the frequency-change detection system using the spin-torque oscillator, there occurs a problem that a read signal output from the spin-torque oscillator is degraded by the phase noise.

BRIEF SUMMARY OF THE INVENTION

According to one aspect of the present invention, there is provided a magnetic reproducing apparatus for reproducing a magnetic disk having a plurality of tracks on which recording bits are sequentially recorded at regular intervals, each of the recording bits generating a magnetic field; a rotating part rotating the magnetic disk; and a magnetic head having a magnetic oscillation element which reads a change of the magnetic field generated from the recording bits depending on the rotation of the magnetic disk, and generates an output signal having an oscillation frequency which is sequentially changed depending on the rotating magnetic disk, the magnetic data recorded on the magnetic disk being reproduced from the output signal, wherein the following equation is satisfied:

$$\left| \omega_0 T - \text{Round}\left[ \frac{\omega_0 T}{\pi} \right] \pi \right| < \arccos\left( 10^{\frac{G}{20}} \sqrt{1 - e^{-\pi \Delta f T}} \right) \quad (1)$$

and $$\left| (\omega_0 + \Delta\omega_{shift})T - \text{Round}\left[ \frac{(\omega_0 + \Delta\omega_{shift})T}{\pi} \right] \pi \right| < \arccos\left( 10^{\frac{G}{20}} \sqrt{1 - e^{-\pi \Delta f T}} \right)$$

In Equation 1, $\omega_0$ indicates an oscillation frequency of the spin-torque oscillator, $\Delta\omega_{shift}$ the frequency shift of the spin-torque oscillator produced by the magnetic field from the magnetic disk, $\Delta f$ the full-width at half maximum (HWHM) of an oscillation spectrum of the spin-torque oscillator, T a read signal period which corresponds to a time period required for reading one recording bit, Round(X) a function that returns the integer closest to a given number X, and G a constant greater than the signal-to-noise ratio of a desired read output signal of the spin-torque oscillator.

DETAILED DESCRIPTION OF THE INVENTION

A magnetic recording and reproducing apparatus according to one embodiment of this invention will be described with reference to the accompanying drawings as required.

Figure 1:
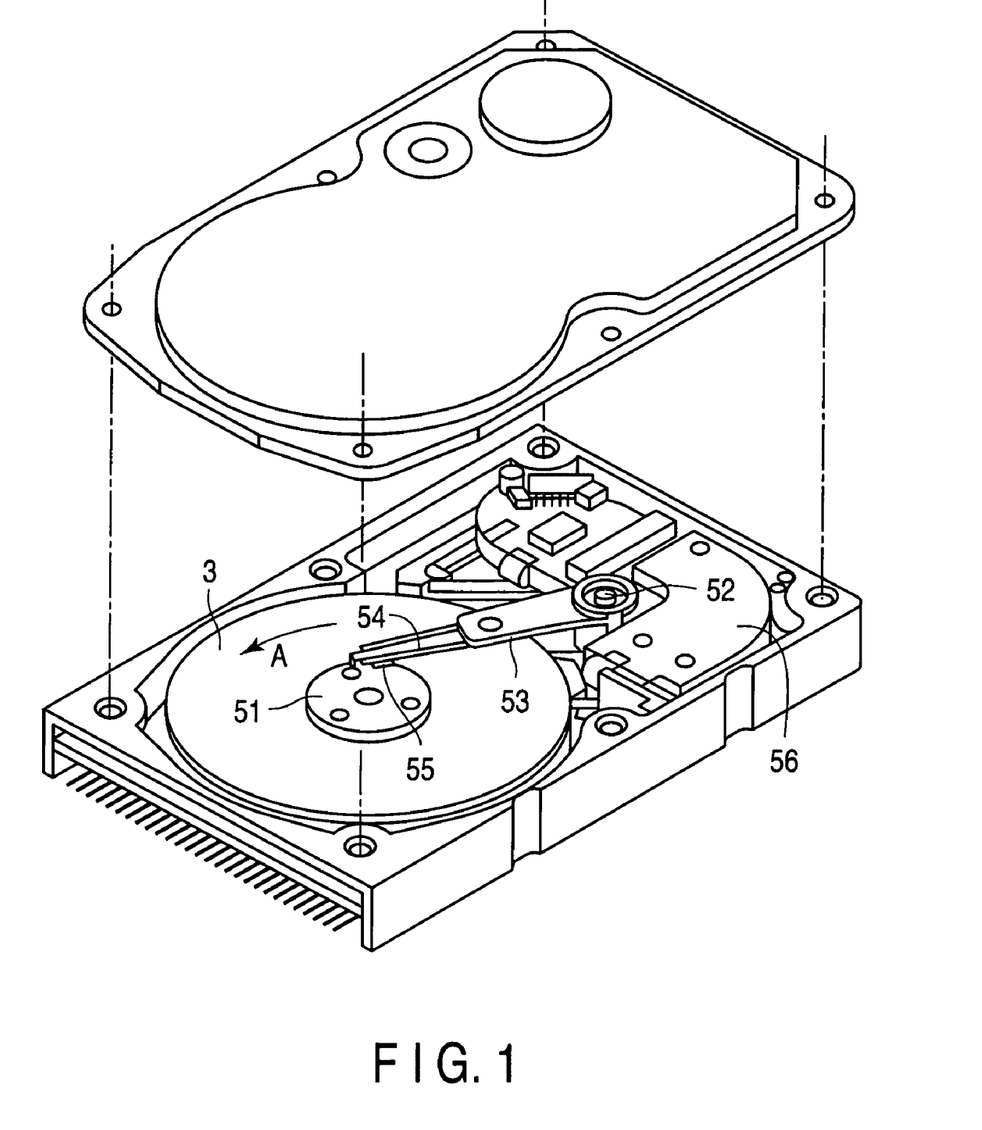
FIG. 1 is a perspective view schematically showing a magnetic recording and reproducing apparatus according to one embodiment of this invention.

FIG. 1 schematically shows the whole structure of a magnetic recording and reproducing apparatus according to one embodiment of this invention. As shown in FIG. 1, the magnetic recording and reproducing apparatus includes a magnetic disk 3 that records data. The magnetic disk 3 is mounted on a spindle 51 and is rotated in a direction indicated by an arrow A by a spindle motor. An actuator arm 53 is held by a pivot 52 arranged near the magnetic disk 3. On the top portion of the actuator arm 53, a suspension 54 is mounted. On the undersurface of the suspension 54, a head slider 55 is supported. As will be described later, a magnetic head 1 is mounted on the head slider 55. Near the base end portion of the actuator arm 53, a voice coil motor 56 that horizontally moves the actuator arm 53 to move the magnetic head 1 to a given position in a diameter direction of the magnetic disk 3 is arranged.

The magnetic disk 3 is rotated and the actuator arm 53 is pivotally moved by the voice coil motor to load the head slider 55 on the magnetic disk 3. Then, the head slider 55 having the magnetic head 1 mounted thereon is held while the surface thereof that faces the medium is kept with a preset floating distance from the surface of the magnetic disk 3. In this state, data recorded on the magnetic disk 3 can be read.

Figure 2:
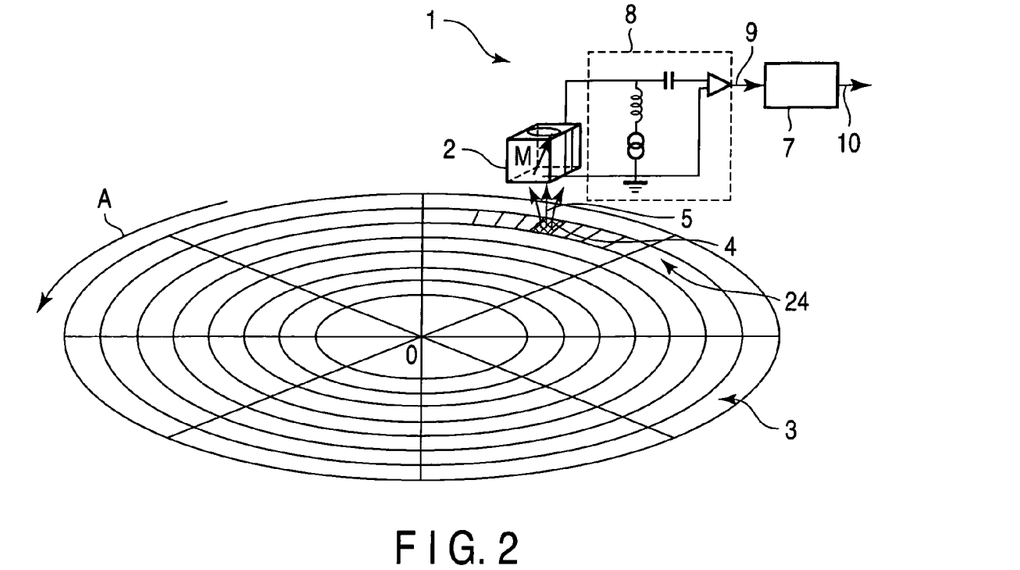
FIG. 2 is a perspective view schematically showing magnetic disk and the magnetic head using a spin-torque oscillator shown in FIG. 1.

FIG. 2 schematically shows the structures of the magnetic read head 1 and magnetic disk 3 shown in FIG. 1. A plurality of circular tracks is formed on the magnetic disk 3 at regular intervals from the center O of the magnetic disk 3. Recording bits 4 are arranged on each track at regular interval.

It is sufficient if a recording bit pitch of the recording bits 4 is set equal in the same track and the recording bit pitch may be different from that on the other track. That is, the recording density may be different for each track. The magnetic disk 3 in which the recording densities of all of the tracks are the same is a magnetic disk of a CDR system. A bit-patterned medium is one of the magnetic disks of a CDR system.

The magnetic recording and reproducing apparatus shown in FIG. 2 includes a spin-torque oscillator 2 which detect a change of a magnetic field 5 generated from the recording bit 4 depending on the rotation of the magnetic disk 3. In the spin-torque oscillator 2, the steady oscillation of the magnetization M of a film-form free magnetic layer is excited by a DC power source contained in a high-frequency extraction circuit 8. The steady oscillation of the magnetization M is converted into voltage oscillation via an MR effect. An output signal is extracted by passing through the high-frequency extraction circuit 8. The oscillation frequency $\omega_0$ of the high-frequency voltage 9 is equivalent to the oscillation frequency of the magnetization M. The magnitude of the high-frequency voltage 9 depends on the magnetic field acting on the magnetization M of the free layer of the spin-torque oscillator 2 and a DC current that causes the steady oscillation of the magnetization M. Further, the magnetic field acting on the magnetization M depends on the size and film thickness of the free layer and an external magnetic field acting on the magnetization M. Therefore, the oscillation frequency $\omega_0/2\pi$ of the spin-torque oscillator 2 depends on the size and film thickness of the free layer, a DC current that causes the steady oscillation of the magnetization M, and the magnitude of an external magnetic field. By properly controlling the above values, the oscillation frequency $\omega_0/2\pi$ of the spin-torque oscillator 2 can be set to a value in the range of approximately 5 to 50 GHz.

Since the oscillation frequency of the high-frequency voltage 9 depends on the external magnetic field, it also depends on a magnetic field 5 from the recording bit 4. In the magnetic recording and reproducing apparatus according to this embodiment, since the magnetic disk 3 is rotated in a direction indicated by an arrow A, the oscillation frequency of the spin-torque oscillator 2 is changed momentarily according to the variation of the magnetic field 5 from the recording bit 4. For example, if '0' is written to the recording bit 4, the oscillation frequency $\omega_0$ is changed to $(\omega_0+\delta\omega_{shift}/2)$ and if '1' is recorded, the oscillation frequency $\omega_0$ is changed to $(\omega_0-\delta\omega_{shift}/2)$. In this case, $\omega_{shift}$ indicates a variation of the oscillation frequency $\omega_0$ changed by the recording bit 4. The oscillation frequency $\omega_0$ of the spin-torque oscillator 2 is sequentially changed by the magnetic field indicating '0' or '1' from the recording bit 4 according to the rotation of the magnetic disk 3 and high-frequency voltage 9 is output via the high-frequency extraction circuit 8. The oscillation frequency $\omega_0$ of the high-frequency voltage 9 is instantly changed to $(\omega_0+\delta\omega_{shift}/2)$ or $(\omega_0-\delta\omega_{shift}/2)$ according to the state of the recording bit 4. Therefore, by detecting a variation in the oscillation frequency $\omega_0$ of the high-frequency voltage 9, data '0' or '1' recorded to the recording bit 4 can be detected. In the magnetic recording and reproducing apparatus according to this embodiment, magnetic data is reproduced by detecting a variation in the frequency of the high-frequency voltage 9, i.e., the output signal by means of a method for inputting the high-frequency voltage 9 to the demodulation circuit 7 to obtain a demodulation signal 10.

Figure 3:
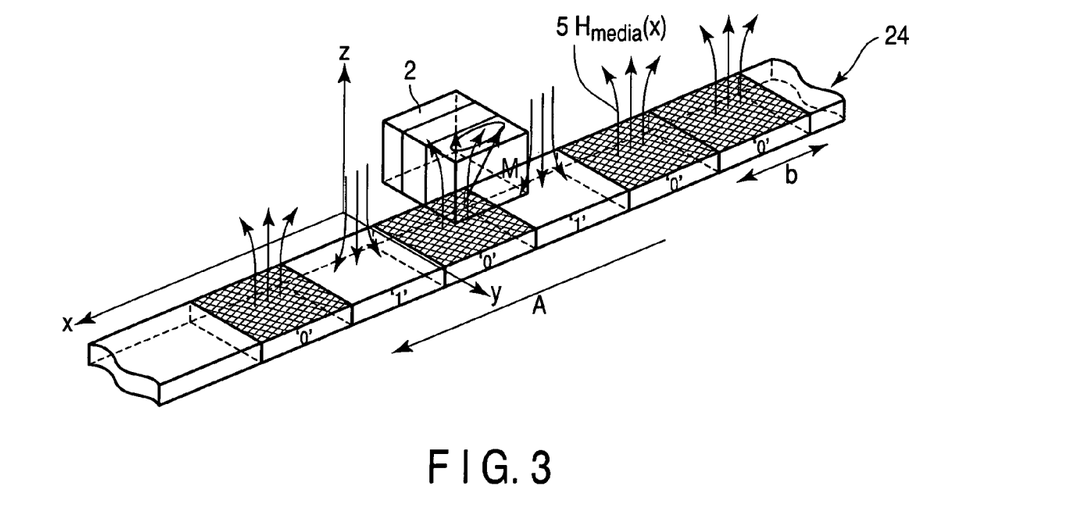
FIG. 3 is a schematic view showing the operation of a spin-torque oscillator and track shown in FIG. 2.

An instantaneous oscillation frequency variation $\delta\omega_{shift}$ of the high-frequency voltage 9 is explained with reference to FIG. 3. FIG. 3 schematically shows a state in which a track 24 on the magnetic disk 3 is moved below the undersurface of the spin-torque oscillator 2. For convenience of the explanation, an coordinate system (xyz coordinate system) is defined on the track 24. In the coordinate system, the rotational movement direction of the track 24, that is, the direction indicated by the arrow A is defined as the x-axis, the radial direction of the magnetic disk 3 is defined as the y-axis and the direction perpendicular to the surface of the magnetic disk 3 is defined as the z-axis. The oscillation frequency $\omega_0$ of the spin-torque oscillator 2 is expressed by the following equation:

$$\omega_0 = \gamma\sqrt{H_{eff}(H_{eff}+4\pi M_s^{eff})} \quad (5)$$

where $\gamma$ indicates a gyromagnetic ratio. The symbol $M_s^{eff}$ indicates effective saturated magnetization of the magnetization M of the magnetization free layer of the spin-torque oscillator 2 and contains a size effect. The symbol $H_{eff}$ indicates an effective magnetic field acting on the magnetization M and contains a size effect, an effect of an external magnetic environment and a spin transfer effect produced by a DC current. The direction of the effective magnetic field $H_{eff}$ is set to the z-axis direction. A magnetic field 5 corresponding to magnetic data '0' or '1' of the recording bit 4 arranged on a track 24 formed on the magnetic disk 3 also acts on the spin-torque oscillator 2. The magnetic field 5 is expressed by $H_{media}(x)$. The effective magnetic field $H_{eff}$ can be written as $(H_{eff}+H_{media}(x))$ by taking the magnetic field 5 into consideration. For convenience of the explanation, it is supposed that the magnetic field 5 from the magnetic disk 3 does not depend on the y coordinate in the track and the direction thereof is set to the z-axis direction. If the spin-torque oscillator 2 lies on the coordinate $x_i$ at time $t_i$, $\delta\omega_{shift}/2$ is expressed by the following equation at time t:

$$\frac{\delta\omega_{shift}(t)}{2} = \gamma \left| \sqrt{(H_{eff}+H_{media}(x))\left(\begin{array}{c}H_{eff}+H_{media}(x)+\\ 4\pi M_S^{eff}\end{array}\right)} - \sqrt{H_{eff}(H_{eff}+4\pi M_S^{eff})} \right| \quad (6)$$

where $x=x_i+v(t-t_i)$. Here, the symbol v indicates the rotational speed of the track 24. In this way, an instantaneous oscillation frequency variation $\delta\omega_{shift}$ of the high-frequency voltage 9 depends on the structure and material of the spin-torque oscillator 2, the spatial dependence of $H_{media}(x)$, and the material of the magnetic disk 3. Now, the concept of the frequency shift $\Delta\omega_{shift}$ of the spin-torque oscillator 2 is introduced. This is a quantity obtained by averaging an oscillation frequency variation $\delta\omega_{shift}$ by use of a time interval (signal period) T from the time when the spin-torque oscillator 2 starts to read a certain recording bit 4 until the next recording bit is read. The time interval T is equal to a bit signal period itself and expressed by T=b/v if the recording bit pitch is set to b. Therefore, the time interval T depends on the designed values of the recording bit pitch b and the rotational speed v of the magnetic disk 3. If time t at which the spin-torque oscillator 2 starts to read a recording bit 4 is set to t=0, the frequency shift $\Delta\omega_{shift}$ is expressed by the following equation:

$$\pm \frac{\Delta \omega_{shift}}{2} = \frac{1}{T} \int_0^T \frac{\pm \delta \omega_{shift}(t)}{2} dt \tag{7}$$

Figure 4:
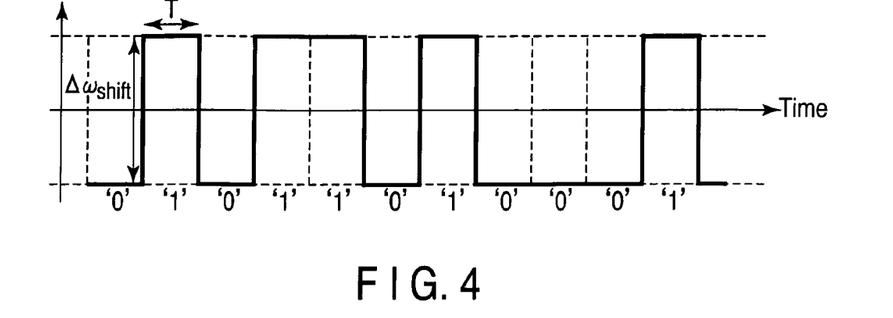
FIG. 4 is a graph schematically showing a signal produced by a magnetic field from a disk detected by the spin-torque oscillator shown in FIG. 2.

FIG. 4 schematically shows the relationship between the frequency shift $\Delta\omega_{shift}$ and a periodic signal s(t) received by the spin-torque oscillator 2 according to the magnetic field 5 from the magnetic disk 3 that sequentially varies in a signal period T.

As described above, in the magnetic recording and reproducing apparatus according to this embodiment, magnetic data is read by demodulating a frequency variation of the high-frequency voltage 9 detected by the spin-torque oscillator 2 by means of the demodulation circuit 7. The frequency variation can be regarded as a continuous phase frequency shift keying (FSK) modulation from the viewpoint of a digital modulation/demodulation theory. An FSK signal in the digital modulation/demodulation theory corresponds to the magnetic field 5 from the recording bit 4 in the magnetic recording and reproducing apparatus shown in FIG. 2. As the FSK signal detection method, three types of representative methods are known: a frequency detection method for detecting a frequency, a delay detection method for detecting a phase difference, and a synchronous detection method for detecting a phase. In the magnetic recording and reproducing apparatus according to this embodiment, a delay detection method is utilized. This is because the signal-to-noise ratio of the output signal is the highest in the case of the delay detection method among the above three types of FSK signal detection methods when magnetic data is read at high speed. The main noise source is phase noise of the spin-torque oscillator 2, that is, phase noise of the high-frequency voltage 9. Therefore, in the method such as the frequency detection method or synchronous detection method that detects a frequency value or phase value, a value used as a reference greatly fluctuates. On the other hand, in the method for detecting the phase difference, noise is determined by the product of a phase shifting speed and the signal period T. Therefore, in the high-speed read operation in which the signal period T is short, noise produced by phase shifting of the oscillation signal of the spin-torque oscillator 2 is smaller in comparison with that in the other methods.

Figure 5:
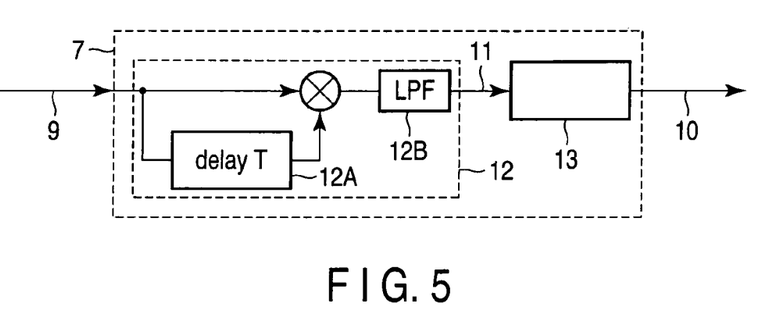
FIG. 5 is a block diagram schematically showing a demodulation circuit shown in FIG. 2.

FIG. 5 schematically shows the demodulation circuit 7 that converts the high-frequency voltage 9 into a demodulated signal 10. The demodulation circuit 7 includes a delay detection circuit 12 and code identification circuit 13. In the demodulation circuit 7, the high-frequency voltage 9 is input to the delay detection circuit 12 that in turn outputs a delay detection output signal 11. The delay detection output signal 11 is input to and converted into a demodulated signal 10 by the code identification circuit 13.

After the high-frequency voltage 9 is input to the delay detection circuit 12, the voltage is divided into two components, one component being passed through a delay line 12A (delay T) having delay time corresponding to the length of the signal period T and the other component being passed without being delayed. Then, the two component signals are multiplied and passed through a low-pass filter 12B (LPF) that in turn outputs a delay detection output signal 11.

Figure 6:
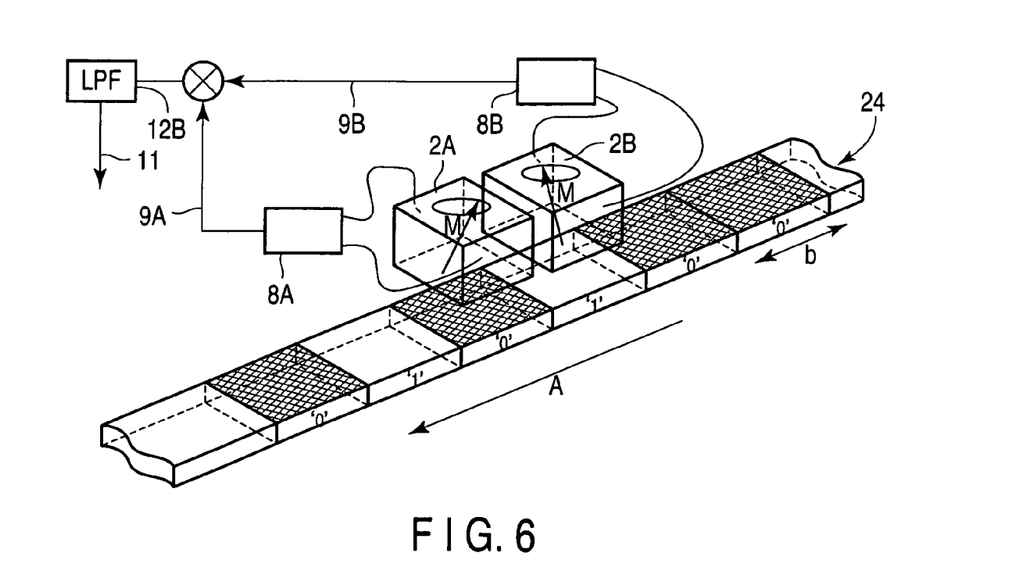
FIG. 6 is a perspective view schematically showing one example of a magnetic recording and reproducing apparatus having the same function as that of a delay detection circuit shown in FIG. 5.

Although, in the above example, the explanation is made by using the term of "delay line" appearing in the digital modulation/demodulation theory, the main point in a case where the delay detection method is used in the magnetic recording and reproducing apparatus shown in FIG. 1 is as follows. When reading magnetic data, the operation of reading a recording bit 4 and shifting the frequency, and reading a next recording bit 4 and further shifting the frequency is repeatedly performed. The main point is to multiply a signal of the high-frequency voltage 9 while a first recording bit 4 is being read by a signal of the high-frequency voltage 9 while a next recording bit 4 appearing after the time T is being read and derive low-frequency components of the result of multiplication to detect the phase difference between the above signals. The method for outputting a signal obtained by multiplying a signal of the high-frequency voltage 9 by a signal of the high-frequency voltage 9 shifted by the period time T (a delay detection output signal 11) is not limited to a method using the delay detection circuit 12 having the delay line 12A. A magnetic head 1 and circuit system may be constructed in order to attain the same effect as that of the delay line without using a delay line. As one example, such a magnetic head is schematically shown in FIG. 6. The magnetic head includes spin-torque oscillators 2A, 2B having the same constituents. The spin-torque oscillators 2A, 2B simultaneously read one recording bit 4. In FIG. 6, a snap shot in which the spin-torque oscillator 2A reads '0' and, at the same time, the spin-torque oscillator 2B reads '1' is schematically shown. The spin-torque oscillators 2A, 2B are respectively connected to high-frequency extraction circuits 8A, 8B and high-frequency voltages 9A, 9B are extracted from the spin-torque oscillators 2A, 2B. If the rotational speed of the track 24 on the magnetic disk is set to v and the recording bit pitch is set to b, then the signal period T is b/v. The period is equal to a time difference between the high-frequency voltage 9A from the spin-torque oscillator 2A and the high-frequency voltage 9B from the spin-torque oscillator 2B. The two signals having the time difference T are multiplied and a delay detection output signal 11 that is a phase-difference signal is obtained by passing the result of multiplication through the low-pass filter 12B.

In the magnetic recording and reproducing apparatus shown in FIG. 1, the phase noise causes the reduction of the signal-to-noise ratio of the delay detection output signal 11. The high-frequency voltage 9 can be described by the following equation:

$$\dot{x}(t) = i(\omega_0 + \xi(t))x(t) \tag{8}$$

where x(t) indicates a complex number. The real part q(t) of x(t) indicates the high-frequency voltage 9:

$$q(t) \equiv Re[x(t)] \tag{9}$$

In equation (8), $\xi(t)$ expresses a random frequency modulation and the average value thereof is 0 and satisfies a Gaussian distribution as indicated by the following equation:

$$<\xi(t)\xi(t')> = 2D\delta(t-t') \tag{10}$$

Figure 7:
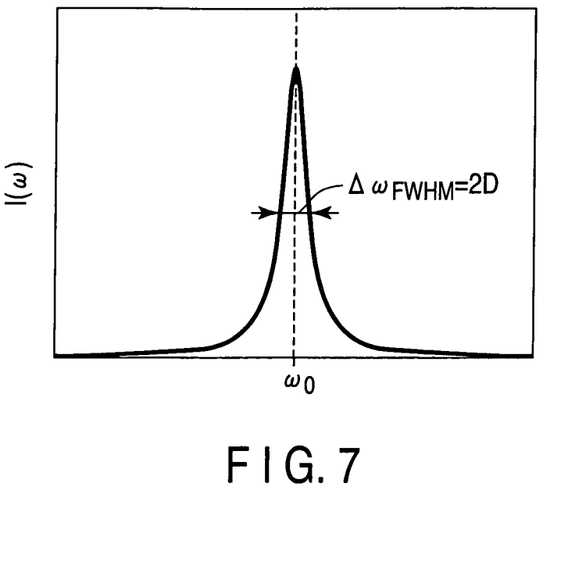
FIG. 7 is a graph schematically showing an oscillation spectrum of the spin-torque oscillator shown in FIG. 2.

As is disclosed in Physical Review Letters 100,017207 (2008), the above model is a simplified model of the spin-torque oscillator in the presence of thermal fluctuation. In equation (10), the symbol D indicates the magnitude of phase noise and is proportional to the temperature at which the magnetic recording and reproducing apparatus shown in FIG. 1 is operated. The effect of amplitude noise produced by the non-linearity of the spin-torque oscillator 2 is included in D. The non-linearity means that an oscillation frequency depends on an oscillation amplitude. According to this model, the shape of the power spectrum I($\omega$) of the high-frequency voltage 9 is Lorentzian as shown in FIG. 7 and the full-width at half maximum (FWHM) $\Delta\omega_{FWHM}$ of the spectrum is given by 2D. That is, the linewidth $\Delta f$ of the oscillation spectrum of the spin-torque oscillator 2 is given by $2D/2\pi$. The linewidth $\Delta f$ can be measured by a spectrum analyzer and expresses the magnitude of phase noise produced by thermal fluctuation.

Therefore, if the linewidth $\Delta f$ increases, the signal-to-noise ratio of the input signal 11 of the code identification circuit 13 is degraded.

At present, it is experimentally known that the minimum value of $\Delta f$ is approximately 3 MHz. The value can be suppressed to 1 MHz or less by improving the structure of the spin-torque oscillator 2.

As described above, in the signal read system of magnetic data in the magnetic recording and reproducing apparatus shown in FIG. 1, the delay detection signal 11 input to the code identification circuit 13 is degraded by phase noise in the spin-torque oscillator 2. In order to suppress occurrence of an error in magnetic data reading, the signal-to-noise ratio of the delay detection signal 11 is needed to be higher than that required by the code identification circuit 13.

A delay detection output signal 11 having a signal-to-noise ratio higher than the signal-to-noise ratio required by the code identification circuit 13 can be acquired by properly setting the rotational speed v of the magnetic disk 3, that is, the read signal period T, the frequency shift $\Delta \omega_{shift}$ of the spin-torque oscillator 2 produced by the magnetic field 5 from the magnetic disk 3, the oscillation frequency $\omega_0$ and the spectral linewidth $\Delta f$ of the spin-torque oscillator 2. As a result, magnetic data can be read with an error suppressed.

The signal-to-noise ratio G [dB] of the input signal 11 required by the code identification circuit 13 depends on the code identification technology, error correction technology and like used in the code identification circuit 13. Further, there occurs a case wherein the signal-to-noise ratio is determined in a compromising fashion by simplifying the structure of the code identification circuit 13 in order to simplify the manufacturing method of the code identification circuit 13. Therefore, it is impossible to unconditionally determine and set the signal-to-noise ratio G [dB] of the input signal 11 to a certain value. However, in an existing magnetic head, it is known that the bit error rate of a signal before error correction is approximately $10^{-6}$ or less. Therefore, in order to correct a bit error of a read signal in the magnetic recording and reproducing apparatus according to this embodiment by means of the existing error correction technology, it is preferable to set the bit error rate to $10^{-6}$ or less. For example, it is known in the digital modulation/demodulation theory that a code error rate $P_\theta$ is given by the following equation in the case of a 2-phase delay detection system:

$$P_e = 0.5 \exp(-10^{SNR/10}) \qquad (11)$$

where SNR indicates the signal-to-noise ratio. When SNR is set to approximately 11 dB, the code error rate $P_\theta$ is set to approximately $10^{-6}$. Therefore, it is preferable that the signal-to-noise ratio G [dB] of the delay detection output signal 11 required by the code identification circuit 13 be set higher than 11 dB. Since the magnetic recording and reproducing apparatus according to this embodiment is designed so that the signal-to-noise ratio of the delay detection output signal 11 will be set higher than 11 dB, the bit error rate of the read signal is lower than $10^{-6}$.

Next, it is explained in detail that how the read signal period T, the frequency shift $\Delta \omega_{shift}$ of the spin-torque oscillator 2 produced by the magnetic field from the magnetic disk 3, the characteristic oscillation frequency $\omega_0$ of the spin-torque oscillator 2 and the FWHM linewidth $\Delta f$ of the oscillation spectrum are adequately determined. Further, it is indicated in the magnetic recording and reproducing apparatus according to this embodiment that the signal-to-noise ratio of the input signal 11 of the code identification circuit becomes higher than the signal-to-noise ratio G [dB] of the detection signal required by the code identification circuit 13 because the above factors are properly determined.

First, an equation that expresses the signal-to-noise ratio of the input signal 11 of the code identification circuit is derived. A condition that the high-frequency voltage 9 of the spin-torque oscillator 2 accompanied by phase noise $\xi(t)$ is subjected to frequency modulation by a periodic signal s(t) of the period T by the magnetic field 5 from the magnetic disk 3 can be modeled by the following equation:

$$\dot{x}(t) = i(\omega_0 + s(t) + \xi(t))x(t) \qquad (12)$$

where s(t) indicates a periodic signal shown in FIG. 4. By solving the differential equation 12, a delay detection output signal $V_{output}(t)$ obtained when the high-frequency voltage 9 is delayed and detected by use of the delay time T is given by the following equation:

$$V_{output}(t) = \langle q(t) q(t-T) \rangle_{LPF} \qquad (13)$$
$$= \frac{q_0^2}{2} \cos(\psi(t) + \phi(t) - \phi(t-T))$$

where $\psi(t)$ and $\phi(t)$ are expressed by the following equation:

$$\psi(t) \equiv \int_{t-T}^{t} s(t') dt' \qquad (14)$$

$$\phi(t) \equiv \omega_0 t + \int_0^t \xi(t') dt' \qquad (15)$$

Further, $q_0$ indicates a peak value of the high-frequency voltage 9 and $\langle \ldots \rangle_{LPF}$ indicates that the signal has passed through the low-pass filter 12B. In this case, $\psi(t)$ expressed by Equation 14 expresses a phase shift which the high-frequency voltage 9 is subjected to during the time T. If time at which the spin-torque oscillator 2 comes to a position of the boundary of the recording bits 4 is set to $t_b$, the phase shift $\psi(t_b)$ which the high-frequency voltage 9 is subjected to during the time from ($t_b$-T) to $t_b$ is set to 0 when recording data is '0' in the case of the periodic signal s(t) as shown in FIG. 4 and is set to $\Delta \omega_{shift} T$ when recording data is '1'.

If no phase noise is present, that is, if D indicating the magnitude thereof is 0, the input signal 11 of the code identification circuit 13 is expressed by the following equation:

$$V_{signal}(t) = \frac{q_0^2}{2} \cos(\omega_0 t + \psi(t)) \qquad (16)$$

Therefore, a noise component $V_{noise}(t)$ of the output signal $V_{output}(t)$ is expressed by the following equation:

$$V_{noise}(t) = V_{output}(t) - V_{signal}(t) \qquad (17)$$

Figure 8:
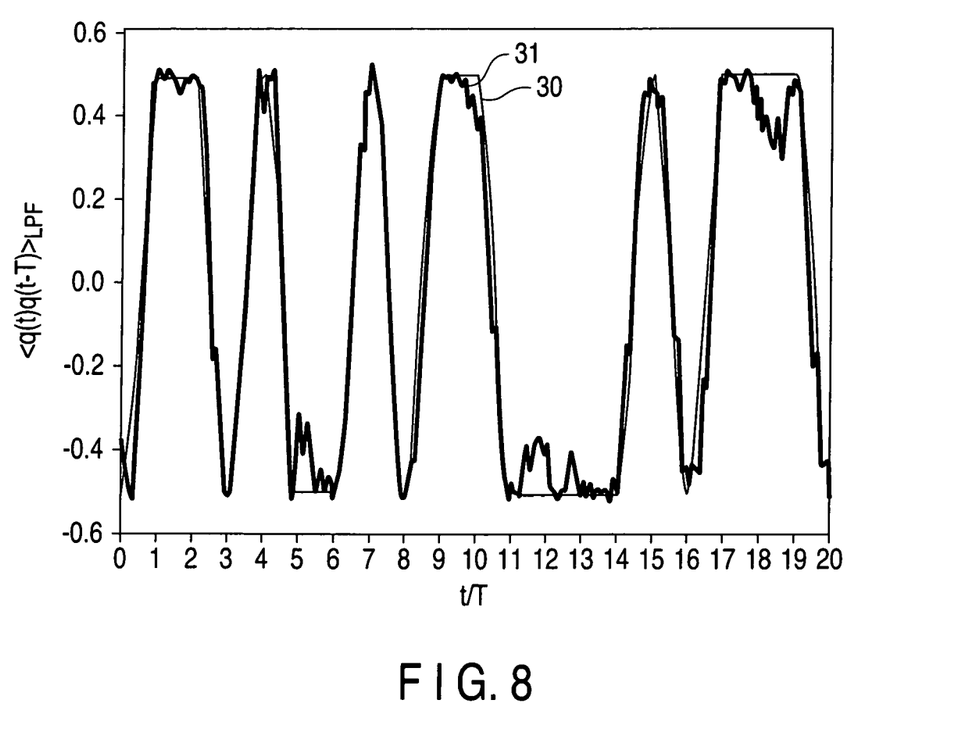
FIG. 8 is a graph schematically showing a delay detection output signal input to a code identification circuit shown in FIG. 2.

FIG. 8 is a graph schematically showing one example of $V_{signal}(t)$ and $V_{output}(t)$.

In FIG. 8, $q_0 = 1$. Noise voltage is defined by time average of $[V_{noise}(t)]^2$. The noise voltage is given by the following equation:

$$\overline{V}_N \equiv \overline{[V_{noise}(t)]^2} \qquad (18)$$

where a subscript bar indicates the time averaging process. Therefore, noise voltage can be evaluated as shown in the following equation by calculating the time average of $[V_{noise}(t)]^2$ based on $V_{noise}(t)$:

$$\overline{V}_N = \frac{q_0^2}{2}\sqrt{1-e^{-DT}} \qquad (19)$$

The time average can be calculated by supposing ergodicity and performing the averaging operation by use of a random variable $\xi(t)$ and the averaging operation by use of magnetic data items '0', '1' that can be regarded as random variables. The signal-to-noise ratio of the input signal 11 of the code identification circuit 13, particularly, the signal-to-noise ratio at time $t_b$ at which the spin-torque oscillator 2 comes to a position of the boundary of the recording bits 4 is given by the following equation:

$$SNR = 20\log_{10}\frac{|V_{signal}(t_b)|}{\overline{V}_N} \qquad (20)$$
$$= 20\log_{10}\frac{|\cos(\omega_0 T + \psi(t_b))|}{\sqrt{1-e^{-DT}}}$$

Next, it is explained that in order to set the signal-to-noise ratio of the input signal of the code identification circuit higher than the signal-to-noise ratio G [dB] required by the code identification circuit 13, a condition is imposed on the relationship between the read signal period T, the frequency shift $\Delta\omega_{shift}$ of the spin-torque oscillator 2 produced by the magnetic field 5 from the magnetic disk 3, the characteristic oscillation frequency $\omega_0$ of the spin-torque oscillator 2 and the FWHM linewidth $\Delta f$ of the oscillation spectrum. In order to set the signal-to-noise ratio of the input signal 11 of the code identification circuit 13 higher than the signal-to-noise ratio G [dB] required by the code identification circuit 13, the following expression must be satisfied:

$$SNR = 20\log_{10}\frac{|\cos(\omega_0 T + \psi(t_b))|}{\sqrt{1-e^{-DT}}} > G \qquad (21)$$

First, since a trigonometric function part in the absolute value of the above expression is periodic, at least a condition of the following equation is necessary:

$$20\log_{10}\frac{1}{\sqrt{1-e^{-DT}}} > G \qquad (22)$$

The following expression can be attained by modifying expression 22:

$$T < -\frac{\ln\left(1-10^{-\frac{G}{10}}\right)}{D} \qquad (23)$$

Equation 21 can be rewritten as indicated by the following equation based on Equation 23:

$$\left|\omega_0 T + \psi(t_b) - \text{Round}\left[\frac{\omega_0 T + \psi(t_b)}{\pi}\right]\pi\right| < \arccos\left(10^{\frac{G}{20}}\sqrt{1-e^{-DT}}\right) \qquad (24)$$

where Round[X] is a function that returns the integer closest to X. Since $\psi(t_b)=0$ or $\Delta\omega_{shift}T$, the condition is identical to the following equation:

$$\left|\omega_0 T - \text{Round}\left[\frac{\omega_0 T}{\pi}\right]\pi\right| < \arccos\left(10^{\frac{G}{20}}\sqrt{1-e^{-\pi\Delta fT}}\right) \qquad (25)$$

and $$\left|(\omega_0+\Delta\omega_{shift})T - \text{Round}\left[\frac{(\omega_0+\Delta\omega_{shift})T}{\pi}\right]\pi\right| < \arccos\left(10^{\frac{G}{20}}\sqrt{1-e^{-\pi\Delta fT}}\right)$$

Here, $D=\pi\Delta f$ is used. Equation 25 includes Equation 23. This is because $\arccos(x)$ is defined on the range of $x<1$ with respect to an argument $x\ (>0)$. Thus, in order to set the signal-to-noise ratio of the input signal of the code identification circuit 13 higher than the signal-to-noise ratio G [dB] required by the code identification circuit 13, the condition expressed by Equation 25 is imposed on the relationship between the read signal period T, the frequency shift $\Delta\omega_{shift}$ of the spin-torque oscillator 2 produced by the magnetic field 5 from the magnetic disk 3, the characteristic oscillation frequency $\omega_0$ of the spin-torque oscillator 2 and the FWHM linewidth $\Delta f$ of the oscillation spectrum.

In the magnetic recording and reproducing apparatus according to this embodiment, the read signal period T due to the rotational speed v of the magnetic disk 3, the frequency shift $\Delta\omega_{shift}$ of the spin-torque oscillator 2 produced by the magnetic field 5 from the magnetic disk 3, the characteristic oscillation frequency $\omega_0$ of the spin-torque oscillator 2 and the FWHM linewidth $\Delta f$ of the oscillation spectrum are determined to satisfy Equation 25. Therefore, the delay detection output signal 11 with the signal-to-noise ratio higher than the signal-to-noise ratio G [dB] of the signal required by the code identification circuit 13 can be provided for the code identification circuit 13 and a magnetic data read process with an error suppressed can be performed. Particularly, when magnetic data of a track having a recording bit pitch b and distance r from the center O of the magnetic disk 3 is read, the signal period T satisfies Equation 25 and the track is rotated with the rotational speed N expressed by the following equation:

$$N = \frac{1}{2\pi}\frac{b}{T}\frac{1}{r} \qquad (26)$$

Therefore, the quality of a signal with the signal-to-noise ratio higher than the signal-to-noise ratio G [dB] of the detection signal required by the code identification circuit 13 can be provided for the input signal 11 of the code identification circuit and a magnetic data read process with an error suppressed can be performed.

As described above, in the magnetic recording and reproducing apparatus according to this embodiment, the signal period T due to the rotational speed v of the magnetic disk 3, the frequency shift $\Delta\omega_{shift}$ of the spin-torque oscillator 2 produced by the magnetic field 5 from the magnetic disk 3, the characteristic oscillation frequency $\omega_0$ of the spin-torque oscillator 2 and the FWHM linewidth $\Delta f$ of the oscillation spectrum are determined to satisfy Equation 25. Then, since it is desired to set the bit error rate in the existing error correction technique less than or equal to $10^{-6}$, it is required to set the signal-to-noise ratio of the input signal 11 of the code identification circuit 13 higher than or equal to (G=) 11 dB. Therefore, an input signal 11 of the code identification circuit 13 having the signal-to-noise ratio of 11 dB or higher can be obtained by determining the respective values to satisfy the following equation in which G=11 is set in Equation 25 and magnetic data can be read with an error suppressed:

$$\left| \omega_0 T - \text{Round}\left[\frac{\omega_0 T}{\pi}\right]\pi \right| < \arccos\left(10^{\frac{11}{20}}\sqrt{1-e^{-\pi\Delta fT}}\right) \quad (27)$$

and $$\left| (\omega_0 + \Delta\omega_{shift})T - \text{Round}\left[\frac{(\omega_0 + \Delta\omega_{shift})T}{\pi}\right]\pi \right| < \arccos\left(10^{\frac{11}{20}}\sqrt{1-e^{-\pi\Delta fT}}\right)$$

For example, in the magnetic recording and reproducing apparatus shown in FIG. 1, the spin-torque oscillators 2 may be rotated with the rotational speed v of 30 m/s when the recording bit pitch b is 30 nm, the frequency shift $\Delta\omega_{shift}/2\pi$ of the spin-torque oscillator 2 produced by the magnetic field from the magnetic disk 3 is set to 20 MHz, the characteristic frequency $\omega_0/2\pi$ of the spin-torque oscillator 2 is set to 10.1 GHz and the FWHM linewidth $\Delta f$ is set to 5 MHz.

In practice, the right side of Equation 27 can be set to a value expressed by the following expression when the recording bit pitch is 30 nm and the rotational speed v is 30 m/s, that is, the signal period T is 1 ns:

$$\arccos\left(10^{\frac{11}{20}}\sqrt{1-e^{-\pi\Delta fT}}\right) \approx 0.3539\pi \quad (28)$$

When the $\Delta\omega_{shift}/2\pi$ is 20 MHz and the characteristic frequency $\omega_0/2\pi$ of the spin-torque oscillator 2 is 10.1 GHz, Equation 27 is satisfied as follows:

$$\left| \omega_0 T - \text{Round}\left[\frac{\omega_0 T}{\pi}\right]\pi \right| = 0.2\pi < 0.3539\pi \quad (29)$$

and $$\left| (\omega_0 + \Delta\omega_{shift})T - \text{Round}\left[\frac{(\omega_0 + \Delta\omega_{shift})T}{\pi}\right]\pi \right| = 0.24\pi < 0.3539\pi$$

Therefore, by designing the respective portions in the magnetic recording and reproducing apparatus shown in FIG. 1 to have the values indicated by the above example, an input signal 11 of the code identification circuit 13 having the signal-to-noise ratio of 11 dB or higher can be obtained.

Further, the read signal period T and the frequency shift $\Delta\omega_{shift}$ of the spin-torque oscillator 2 produced by the magnetic field from the magnetic disk 3 can be determined to satisfy the following equation in addition to the condition of Equation 25:

$$|\Delta\omega_{shift} T - \pi| < \frac{\pi}{2} \quad (30)$$

By determining the rotational speed of the magnetic disk 3 and the characteristics of the other magnetic disks according to equations 25 and 30, wave distortion in the high-frequency transmission line used to transmit the high-frequency voltage 9 and the input signal 11 of the code identification circuit 13 is suppressed and occurrence of a transmission error can be prevented. Next, it is explained that why a transmission error can be prevented by considering the equation 30.

A power spectrum I($\omega$) of the spin-torque oscillator 2 in the presence of frequency modulations is expressed by the following equation by modeling x(t) expressing the high-frequency voltage 9 output from the spin-torque oscillator 2 frequency-modulated by the periodic signal s(t) with the period T shown in FIG. 4 by using Equation 12 in which $\xi(t)=0$ is set and regarding codes '0' and '1' of the signal as random variables:

$$I(\omega) = \frac{2T\left(\frac{\Delta\omega_{shift}T}{2}\right)^2 \left[ j_0\left(\frac{T}{2}\left(\omega - \omega_0 - \frac{\Delta\omega_{shift}}{2}\right)\right) \right]^2}{3 + \cos(\Delta\omega_{shift}T) - 2\cos\left(\left(\omega - \omega_0 - \frac{\Delta\omega_{shift}}{2}\right)T\right) - 2\cos\left(\left(\omega - \omega_0 + \frac{\Delta\omega_{shift}}{2}\right)T\right)} \quad (31)$$

Figure 9:
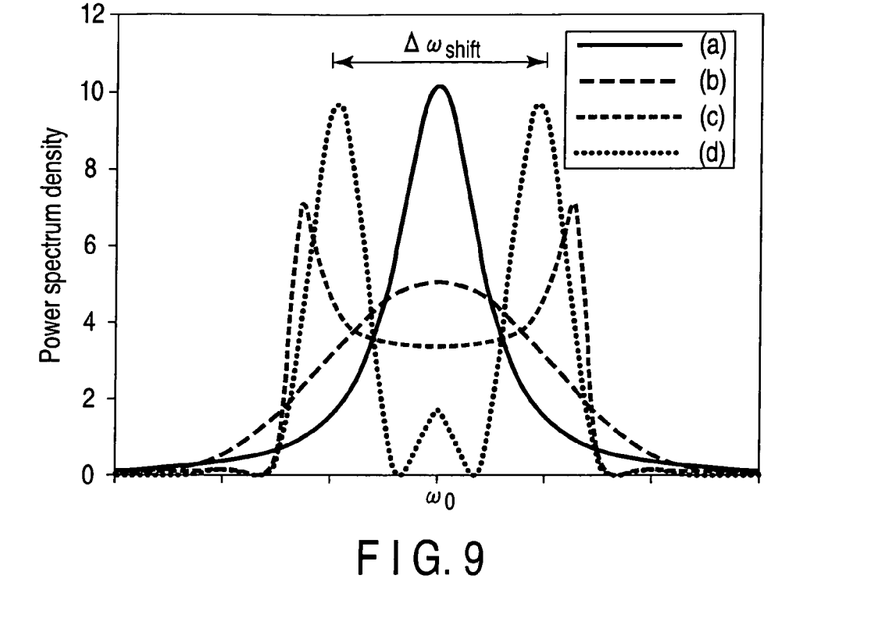
FIG. 9 is a graph schematically showing one example of a power spectrum of the spin-torque oscillator shown in FIG. 2.

As indicated by this equation, the spectrum shape depends on $\Delta\omega_{shift}T$. In equation 31, $j_0(u)$ indicates a $0_{th}$ order spherical Bessel function. In FIG. 9, power spectra of the spin-torque oscillator 2 frequency-modulated are shown for several values of $\Delta\omega_{shift}T$ in Equation 31 as an example. The line (a) indicates a case of $\Delta\omega_{shift}T=\pi/2$, the line (b) a case of $\Delta\psi_{shift}T=\pi$, the line (c) a case of $\Delta\omega_{shift}T=3\pi/2$, and the line (d) a case of $\Delta\omega_{shift}T=3\pi$. In the case of $\Delta\omega_{shift}T$ having values in the range of Equation 30, the spectra components are concentrated in a portion near the oscillation frequency $\omega_0$ of the spin-torque oscillator 2. However, in the case of $\Delta\omega_{shift}T$ having values beyond the above range, for example, the frequency band of the high-frequency signal 9 is spread as shown by the line (d) in FIG. 9 and the spectrum component thereof is spread into a wider band. In general, the high-frequency transmission line has a transmission frequency characteristic. Therefore, the extent of waveform distortion increases if the frequency band of a signal is wider and, as a result, a transmission error tends to occur. However, in the magnetic recording and reproducing apparatus according to this embodiment, the rotational speed of the magnetic disk and the characteristics of the other magnetic disks are determined so that the read signal period T and the frequency shift $\Delta\omega_{shift}$ of the spin-torque oscillators 2 produced by the magnetic field from the magnetic disk 3 will satisfy Equation 30. Therefore, waveform distortion in the high-frequency transmission line that transmits the high-frequency voltage 9 and the input signal 11 of the code identification circuit is suppressed.

It is preferable that the high-frequency transmission line that transmits the high-frequency voltage 9 and the input signal 11 of the code identification circuit 13 be designed to efficiently transmit a high-frequency signal having a frequency near the oscillation frequency $\omega_0$ of the spin-torque oscillator 2.

Further, since a trigonometric function that is a periodic function is contained in Equation 21, the signal-to-noise ratio of the input signal 11 of the code identification circuit 13 becomes high when m is set to a positive integral number to satisfy the following equation:

$$\omega_0 T + \psi(t_b) = m\pi \quad (32)$$

Since $\psi(t_b)$ is 0 or $\Delta\omega_{shift}T$, Equation 32 is equivalent to the following equation:

$$\Delta\omega_{shift}T = l\pi \quad (33)$$

$$\omega_0 T = n\pi \quad (34)$$

where l, n are positive integers. The following equation can be obtained by dividing Equation 34 by Equation 33:

$$\omega_0 = \frac{n}{l}\Delta\omega_{shift} \quad (35)$$

where n and l are positive integral numbers.

Therefore, in the magnetic recording and reproducing apparatus shown in FIG. 1, a delay detection output signal 11 having a high signal-to-noise ratio can be obtained and the signal can be read with an error suppressed when the oscillation frequency $\omega_0$ of the spin-torque oscillator 2 and the frequency shift $\Delta\omega_{shift}$ of the spin-torque oscillator 2 produced by the magnetic field 5 from the magnetic disk 3 satisfy Equation 35 in addition to the condition of Equation 25.

Further, when the oscillation frequency $\omega_0$ of the spin-torque oscillator 2 and the frequency shift $\Delta\omega_{shift}$ of the spin-torque oscillator 2 produced by the magnetic field 5 from the magnetic disk 3 are related according to Equation 35, Equation 25 can be rewritten as the following expression:

$$\left|\Delta\omega_{shift}T - \text{Round}\left[\frac{\Delta\omega_{shift}T}{\pi}\right]\pi\right| < \arccos\left(10^{\frac{G}{20}}\sqrt{1-e^{-\pi\Delta fT}}\right) \quad (36)$$

Expression 36 determines the range of the signal period T permitted to acquire the input signal 11 of the code identification circuit 13 having a signal-to-noise ratio higher than the signal-to-noise ratio G [dB] required by the code identification circuit 13 in a condition that the oscillation frequency $\omega_0$ of the spin-torque oscillator 2 and the frequency shift $\Delta\omega_{shift}$ are determined to satisfy Equation 35.

In the magnetic recording and reproducing apparatus shown in FIG. 1, the oscillation frequency $\omega_0$ of the spin-torque oscillator 2 and the magnetic disk 3 are designed so that the oscillation frequency $\omega_0$ of the spin-torque oscillator 2 and the frequency shift $\Delta\omega_{shift}$ of the spin-torque oscillator 2 produced by the magnetic field from the magnetic disk 3 will satisfy Equation 35 in addition to Equation 25. That is, the track having a recording bit pitch b on the magnetic disk 3 is rotated and operated at the rotational speed v=b/T so that the signal period T will satisfy Expression 36. As a result, a delay detection output signal 11 having a signal-to-noise ratio higher than the signal-to-noise ratio G [dB] required by the code identification circuit 13 can be obtained and the signal can be read with an error suppressed.

The following expression can be obtained based on the inclusive relationship between Expression 36 obtained when the oscillation frequency $\omega_0$ of the spin-torque oscillator 2 and the frequency shift $\Delta\omega_{shift}$ of the spin-torque oscillator 2 produced by the magnetic field from the magnetic disk 3 are related according to Equation 35 and Equation 30 obtained as a conditional equation expressing that waveform distortion in the high-frequency transmission line is suppressed:

$$\left|\Delta\omega_{shift}T - \pi\right| < \arccos\left(10^{\frac{G}{20}}\sqrt{1-e^{-\pi\Delta fT}}\right) \quad (37)$$

Expression 37 contains an inequality to obtain a delay detection output signal 11 having a signal-to-noise ratio higher than the signal-to-noise ratio G [dB] required by the code identification circuit 13 in a condition that the oscillation frequency $\omega_0$ of the spin-torque oscillator 2 and the frequency shift $\Delta\omega_{shift}$ are determined to satisfy Equation 35 and an inequality to determines the range of the signal period T in which waveform distortion in the high-frequency transmission line is suppressed.

Therefore, in the magnetic recording and reproducing apparatus according to this embodiment, the oscillation frequency $\omega_0$ of the spin-torque oscillator 2 and the magnetic disk 3 are designed so that the oscillation frequency $\omega_0$ of the spin-torque oscillator 2 and the frequency shift $\Delta\omega_{shift}$ of the spin-torque oscillator 2 produced by the magnetic field from the magnetic disk 3 will satisfy Equation 35. Then, a delay detection output signal 11 having a signal-to-noise ratio higher than the signal-to-noise ratio G [dB] required by the code identification circuit 13 can be obtained and the signal can be read with an error suppressed by rotating a track having a recording bit pitch b on the magnetic disk 3 at the rotational speed v=b/T in order for the signal period T to satisfy Expression 37.

The operation speed v of the track is determined by the rotational speed of the magnetic disk 3 and the distance from the center O of the magnetic disk 3 to the track. Therefore, when a certain value is determined as a value of the signal period T to satisfy Equation 25, it is necessary to change the rotational speed of the magnetic disk 3 for each track in order to set the operation speeds v of all of the tracks to v=b/T. In this case, the highly sophisticated technique is required as a servo technique for a spindle motor used to rotate the magnetic disk 3. However, the magnetic disk 3 and spin-torque oscillator 2 can be designed to satisfy Equation 25 that is regarded as determining the range of the signal period T permitted to obtain an input signal 11 of the code identification circuit 13 having a signal-to-noise ratio higher than the signal-to-noise ratio G [dB] required by the code identification circuit 13 or Expression 36 or 37 obtained by restricting the above equation and a variable range is given to the signal period T for each track. As a result, zones formed of sets of tracks according to the distance from the center O of the magnetic disk 3 can be set and the rotational speed of the magnetic disk 3 can be set for each zone. Therefore, it becomes unnecessary to change the rotational speed of a motor that rotates the magnetic disk for each track and the set number of the rotational speeds can be greatly decreased.

Figure 10:
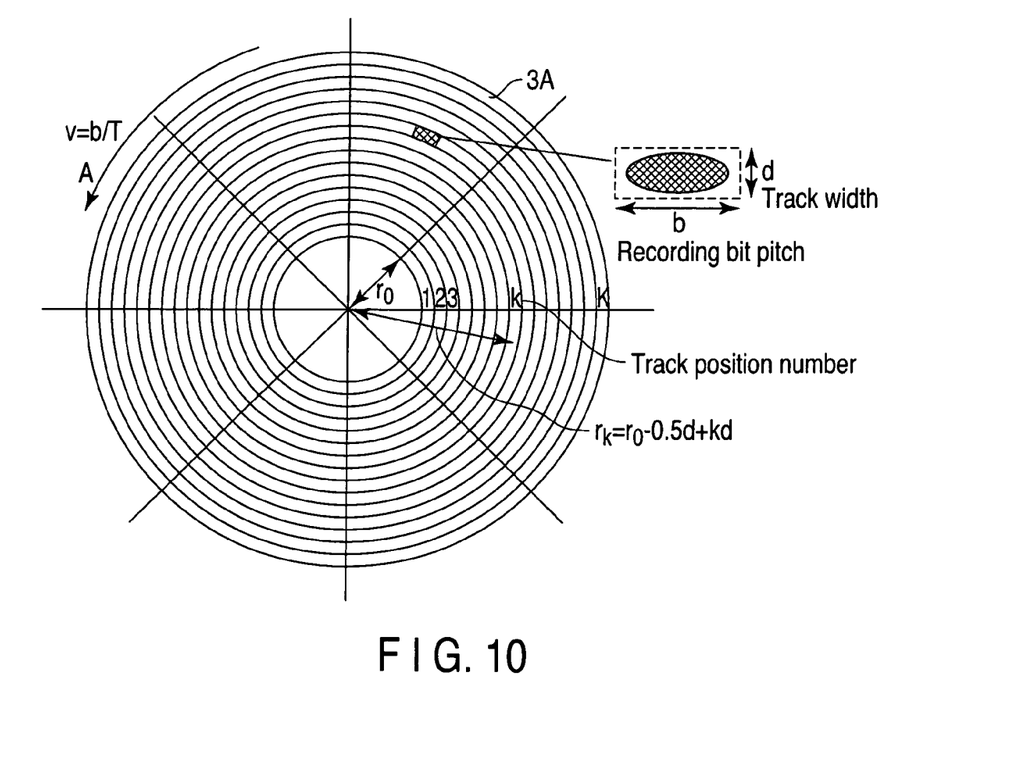
FIG. 10 is a plan view schematically showing one example in which a magnetic disk of a CDR system is used in the magnetic recording and reproducing apparatus shown in FIG. 1.

Next, the configuration of the magnetic recording and reproducing apparatus according to the embodiment of this invention is explained with reference to FIG. 10 to FIG. 13. FIG. 10 schematically shows a magnetic disk 3A in the configuration example of the magnetic recording and reproducing apparatus according to the embodiment of this invention. The magnetic disk 3A is a magnetic disk 3A of a CDR system, the recording bit pitch is set to 30 nm and the track width d is set to 20 nm (the recording density is approximately 1.075 Tbit/inch$^2$). Further, the inner diameter $r_0$ is set to 0.4 inch and the outer diameter R is set to 1.25 inch. The spin-torque oscillator 2 has a characteristic that the oscillation frequency $\omega_0/2\pi$ is approximately 12 GHz and the FWHM linewidth $\Delta f$ of an oscillation spectrum is 3 MHz. It is supposed that a minimum of 20 dB is required as the signal-to-noise ratio of a read signal output in the magnetic recording and reproducing apparatus configured by the magnetic disk 3A of the CDR system and the spin-torque oscillator 2. As described before, the magnetic recording and reproducing apparatus according to the embodiment of this invention in which the rotational speed of the track and the property to be satisfied by the magnetic disk 3A of the CDR system that meets the above requirement are determined and the signal-to-noise ratio of a read signal output is set higher than 20 dB can be provided. Next, one example of the property and rotational speed to be satisfied by the magnetic disk 3 of the CDR system is explained in detail.

In the magnetic recording and reproducing apparatus according to this embodiment, the property and rotational speed to be satisfied by the magnetic disk 3 of the CDR system are provided so that the read signal period T due to rotation of the magnetic disk 3A of the CDR system and the frequency shift $\Delta\omega_{shift}$ of the spin-torque oscillator 2 produced by the magnetic field from the magnetic disk 3A of the CDR system will satisfy Equation 35 and Expression 37. A read signal output having a signal-to-noise ratio higher than the required signal-to-noise ratio G [dB] can be obtained and waveform distortion in the high-frequency transmission line can be suppressed. In this example, it is supposed that the required signal-to-noise ratio is 20 dB. At this time, Expression 37 is written as the following expression:

$$|\Delta\omega_{shift}T-\pi|<\arccos(10\sqrt{1-e^{-\pi\Delta f/T}}) \tag{38}$$

Further, Equation 35 is modified into the following equation:

$$\Delta\omega_{shift} = \frac{1}{n}\omega_0 \tag{39}$$

where n and l are positive integers.

First, the signal period T and the frequency shift $\Delta\omega_{shift}$ of the spin-torque oscillator 2 that satisfy Expressions 38 and 39 are determined. If n=3 and l=1 in Expression 39, $\Delta\omega_{shift}/2\pi$ is set to approximately 0.6366 GHz. The signal period T that satisfies Expression 38 satisfies the following equation:

$$\Delta\omega_{shift}T\approx\pi \tag{40}$$

Therefore, T may be set to approximately 0.7854 ns. Based on this criterion, $\Delta\omega_{shift}/2\pi$ is set to 0.64 GHz and T is set to 0.79 ns. In the case of $\Delta\omega_{shift}/2\pi=0.64$ GHz, it is necessary to set $\omega_0/2\pi$ to 12.0637 GHz. The oscillation frequency $\omega_0$ of the spin-torque oscillator 2 can be easily adjusted by changing the magnitude of the DC current for excitation. Since $\Delta f$ is now set to 3 MHz, the right hand side of Expression 38 is set to a value indicated by the following expression in the case of T=0.79 ns:

$$\arccos(10\sqrt{1-e^{-\pi\Delta f/T}})=0.533026 \tag{41}$$

Further, the left side of Expression 38 is set to a value indicated by the following expression:

$$|\Delta\omega_{shift}T-\pi|=0.03519 \tag{42}$$

Therefore, $\Delta\omega_{shift}/2\pi=0.64$ GHz and T=0.79 ns satisfy Expressions 38 and 39. The fact that the signal period T is 0.79 ns corresponds to the fact that the read speed is approximately 1.26 Gbit/s. As a result, the read signal period T due to rotation of the magnetic disk 3A of the CDR system and the frequency shift $\Delta\omega_{shift}$ of the spin-torque oscillator 2 produced by the magnetic field from the magnetic disk 3A of the CDR system are determined to set $\Delta\omega_{shift}/2\pi=0.64$ GHz and T=0.79 ns as one example. Thus, a variation in the oscillation frequency of the spin-torque oscillator 2 having a signal-to-noise ratio of the read signal output higher than 20 dB is detected and the magnetic data read operation is performed.

Further, in order to meet the requirement of $\Delta\omega_{shift}/2\pi=0.64$ GHz, the magnitude $H_{media}$ of the magnetic field from the magnetic disk 3A of the CDR system is determined. The required magnitude of the magnetic field is roughly estimated according to the following equation obtained by averaging the space dependency and simplifying Equation 6:

$$\Delta\omega_{shift} \approx 2\gamma\left(\sqrt{\frac{(H_{eff}+H_{media})\left(H_{eff}+H_{media}+4\pi M_S^{eff}\right)}{\sqrt{H_{eff}\left(H_{eff}+4\pi M_S^{eff}\right)}}}\right) \approx \gamma\frac{2H_{eff}+4\pi M_S^{eff}}{\sqrt{H_{eff}\left(H_{eff}+4\pi M_S^{eff}\right)}}H_{media} \tag{43}$$

where it is supposed that $H_{media}$ is smaller than $H_{eff}$ and $4\pi M_s^{eff}$. $H_{eff}$ indicates an effective magnetic field having the effect (spin-torque effect) of a DC current to excite magnetization oscillation of the spin-torque oscillator 2 and is derived from the following equation:

$$\gamma\sqrt{H_{eff}(H_{eff}+4\pi M_S^{eff})}=\omega_0 \tag{44}$$

If a spin-torque oscillator 2 having values of $\gamma=1.76\times10^7$ [1/Oe·s] and $M_s^{eff}=800$ emu/cm$^3$ is used, $H_{eff}$ is set to approximately 1592.7 Oe. Therefore, the magnitude $H_{media}$ of the magnetic field from the magnetic disk 3A of the CDR system corresponding to $\Delta\omega_{shift}/2\pi=0.64$ GHz is set to approximately 74 Oe according to Equation 43.

The rotational speed of the track of the magnetic disk 3A of the CDR system is set to v=37.97 m/s based on the requirement of T=0.79 ns. Therefore, the rotational speed at which the magnetic disk 3A of the CDR system should be rotated is determined. Since the track width d is 20 nm, the inner diameter $r_0$ is 0.4 inches and the outer diameter R is 1.25 inches on the magnetic disk 3A of the CDR system, the total number K of tracks is given by the following equation:

$$K=(R-r_0)/d=1.0795\times10^6 \tag{45}$$

As shown in FIG. 10, the distance from the disk center to a kth ($1\leq k\leq K$) track is expressed by the following equation:

$$r_k = r_0 - \frac{d}{2} + kd \tag{46}$$

When the kth track is read, the kth track is operated at the rotational speed expressed by the following equation:

$$f_k = \frac{1}{2\pi}\frac{v}{r_k} \tag{47}$$

Figure 11:
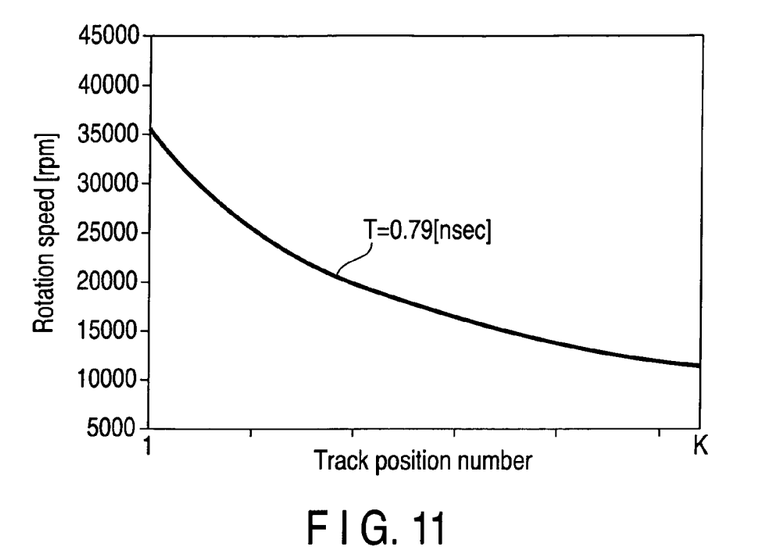
FIG. 11 is a graph showing one example of the rotational speed of the magnetic disk of the CDR system shown in FIG. 10.

FIG. 11 is a graph that shows Equation 47 and in which the track position number is indicated on the abscissa and the track rotational speed is indicated on the ordinate. The average value of the magnitudes of the magnetic fields from the magnetic disk 3 of the CDR system is set to 74 Oe and the rotational speed of each track is determined according to Equation 47.

As described above, a magnetic recording and reproducing apparatus having characteristics of the high density, high-speed reading and high signal-to-noise ratio can be configured. In the magnetic recording and reproducing apparatus, the read speed is set to approximately 1.26 Gbit/s, the recording density of the magnetic disk 3A of the CDR system is set to approximately 1.075 Tbit/inch$^2$, the inner diameter $r_0$ is set to 0.4 inch and the outer diameter R is set to 1.25 inch. Further, the oscillation frequency $\omega_0/2\pi$ of the spin-torque oscillator 2 is set to approximately 12 GHz and the FWHM linewidth $\Delta f$ of an oscillation spectrum is 3 MHz. In addition, the signal-to-noise ratio of the read signal output of the spin-torque oscillators 2 is set higher than 20 dB.

The read signal period T due to the speed v of rotation of the magnetic disk 3 of the CDR system, the frequency shift $\Delta\omega_{shift}$ of the spin-torque oscillator 2 produced by the magnetic field from the magnetic disk 3A of the CDR system, the characteristic oscillation frequency $\omega_0$ of the spin-torque oscillator 2 and the FWHM linewidth $\Delta f$ an oscillation spectrum are determined to satisfy Equation 25.

Further, in the magnetic recording and reproducing apparatus, the rotational speed of the magnetic disk 3 of the CDR system can be determined for each zone. In the above examples, $\Delta\omega_{shift}/2\pi$ is set to 0.64 GHz and T is set to 0.79 ns. However, the range of the rotational speed of the magnetic disk 3 of the CDR system can be divided for respective zones by setting a value in the range of $T_{min}<T<T_{max}$ that satisfies Equation 38 as T in a condition that $\Delta\omega_{shift}/2\pi$ is fixedly set at 0.64 GHz. For example, zone division can be made as follows. The right side of Expression 38 is expressed by the following equation by slightly restricting Expression 38 by taking it into consideration that it monotonously decreases with respect to T:

$$|\Delta\omega_{shift}T-\pi| < arccos(10\sqrt{1-e^{-\pi\Delta f T_{max}}}) \qquad (48)$$

$T_{max}$ in Expression 48 satisfies the following equation:

$$\Delta\omega_{shift}T_{max}=\pi+arccos(10\sqrt{1-e^{-\pi\Delta f T_{max}}}) \qquad (49)$$

Figure 12:
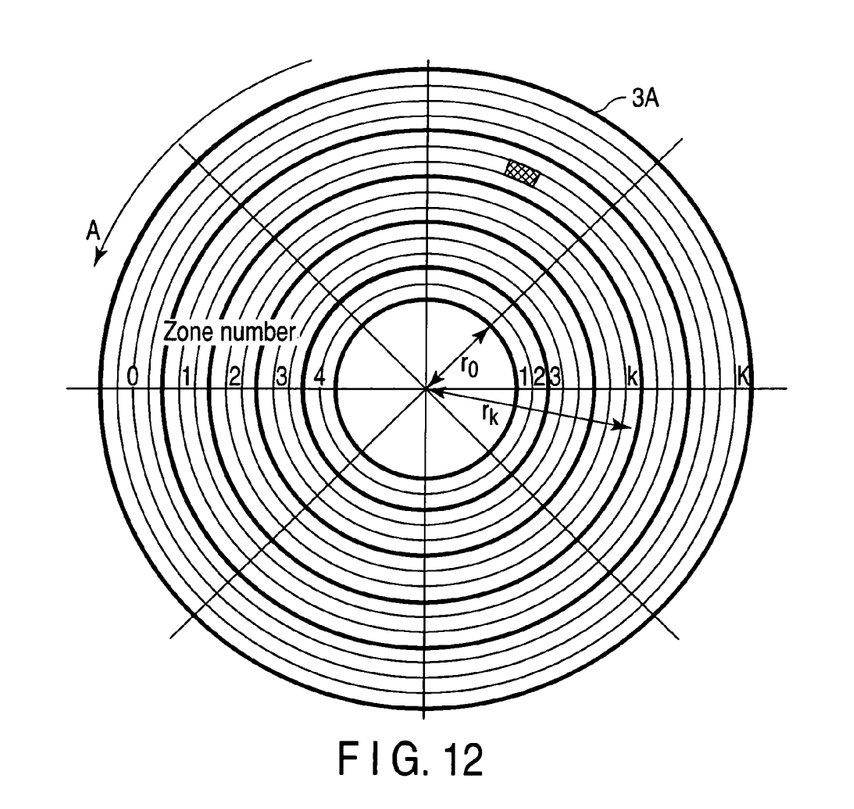
FIG. 12 is a plan view schematically showing one example of zone division of the magnetic disk of the CDR system shown in FIG. 10.
Figure 13:
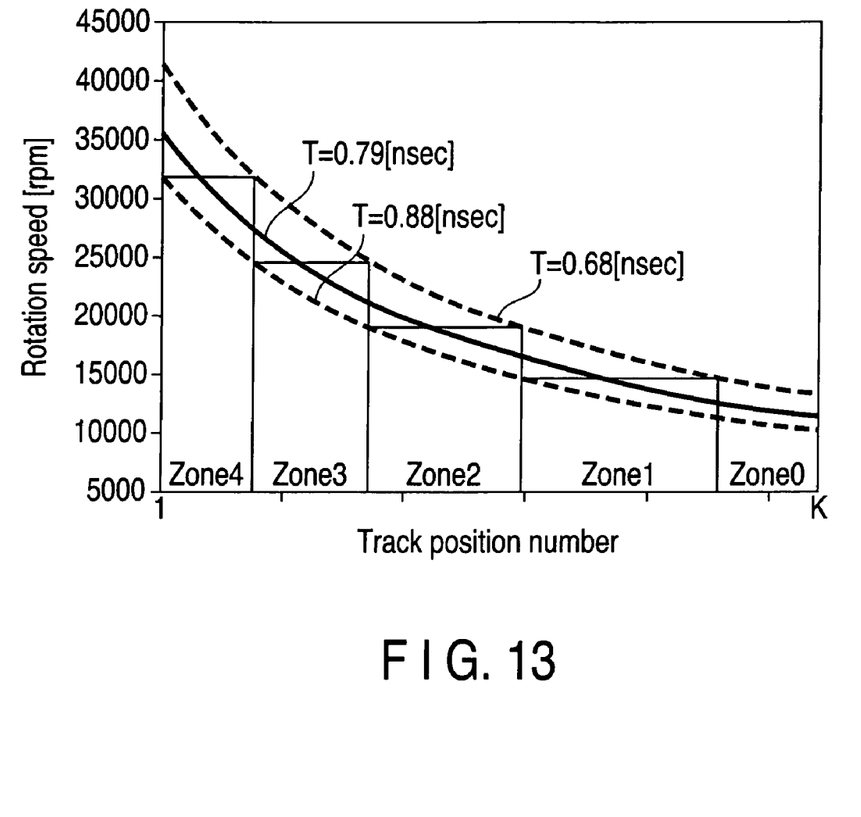
FIG. 13 is a graph schematically showing the rotational speed for each zone and zone division of the magnetic disk of the CDR system shown in FIG. 12.

By solving the above equation, $T_{max}$ is set to approximately 0.886 ns. Thus, $T_{max}$ can be set to 0.886 ns. $T_{min}$ is set to approximately 0.674 ns based on $T_{max}$ and Expression 48. Thus, $T_{min}$ can be set to 0.68 ns. If T set in the range of $0.68<T<0.88$ of the thus properly determined T satisfies Expression 38, and therefore, if the magnetic disk 3A of the CDR system is operated at the operation speed v=b/T that satisfies $0.68<T<0.88$, then the signal-to-noise ratio of the read signal output is set higher than 20 dB. Zone division can be specifically determined according to Expression of $0.68<T<0.88$ and Equation 47. Examples of the zone division of the rotational speed of the magnetic disk 3A of the CDR system and the rotational speed in each zone are shown in FIGS. 12 and 13. As shown in FIG. 13, the rotational speed required for reading magnetic data of each track is a value in a region surrounded by broken lines obtained at the time of T=0.68 and T=0.88 in Equation 47. In this example, as shown in FIG. 12, the disk can be divided into five zones, the number of the outermost zone is set to '0' and the zones '0' to '4' are sequentially set in an order from the outermost side. As shown in FIG. 13, when the track contained in the zone '0' is read, the track may be operated at the rotational speed of approximately 12000 rpm, when the track contained in the zone '1' is read, the track may be operated at the rotational speed of approximately 15000 rpm, when the track contained in the zone '2' is read, the track may be operated at the rotational speed of approximately 19000 rpm, when the track contained in the zone '3' is read, the track may be operated at the rotational speed of approximately 24500 rpm, and when the track contained in the zone '4' is read, the track may be operated at the rotational speed of approximately 32000 rpm.

In the magnetic recording and reproducing apparatus according to the embodiment of this invention, the magnetic disk 3A can be divided into zones and the respective rotational speeds can be determined for the respective zones, and therefore, a troublesome operation of determining the rotational speed for each track can be alleviated.

As described above, in order for the read signal in the magnetic recording and reproducing apparatus configured by the spin-torque oscillator 2 and magnetic disk 3 to satisfy a desired signal-to-noise ratio, a criterion used to properly determine the speed of rotation of the magnetic disk, that is, various values such as the read signal period T, the frequency shift of the spin-torque oscillator 2 produced by the magnetic field from the magnetic disk 3 and the characteristic of the spin-torque oscillator 2 is given in this invention. The magnetic recording and reproducing apparatus configured by the spin-torque oscillator and magnetic disk according to this invention makes it possible to configure a magnetic recording apparatus that has characteristics of a high signal-to-noise ratio together with high-speed reading and high-density recording operations.

In the magnetic recording and reproducing apparatus of this invention, it is possible to provide the magnetic recording and reproducing apparatus that has the magnetic head 1 having the spin-torque oscillator 2 and the magnetic disk 3 and has characteristics of a high signal-to-noise ratio together with high-speed reading and high-density recording operations and in which a criterion used to properly determine various quantities such as the speed of rotation of the magnetic disk, the frequency shift of the spin-torque oscillator produced by the magnetic field from the magnetic disk and the characteristic of the spin-torque oscillator in order for the read signal to satisfy a desired signal-to-noise ratio is determined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic reproducing apparatus for reproducing a magnetic data, comprising:
   a magnetic disk having a plurality of tracks on which recording bits are sequentially recorded at regular intervals, each of the recording bits generating a magnetic field;
   a rotating part rotating the magnetic disk; and
   a magnetic head having a spin-torque oscillator which reads a change of the magnetic field generated from the recording bits depending on the rotation of the magnetic disk, and generates an output signal having an oscillation frequency which is sequentially changed depending on the rotating magnetic disk, the magnetic data recorded on the magnetic disk being reproduced from the output signal,
   wherein the following equation is satisfied:

$$\left|\omega_0 T - \text{Round}\left[\frac{\omega_0 T}{\pi}\right]\pi\right| < \arccos\left(10^{\frac{G}{20}}\sqrt{1-e^{-\pi\Delta f T}}\right) \qquad (1)$$

and

-continued $$\left|(\omega_0 + \Delta\omega_{shift})T - \text{Round}\left[\frac{(\omega_0 + \Delta\omega_{shift})T}{\pi}\right]\pi\right|$$
$$< \arccos\left(10^{\frac{G}{20}}\sqrt{1-e^{-\pi\Delta fT}}\right)$$

where $\omega_o$ indicates an oscillation frequency of the spin-torque oscillator, $\Delta\omega_{shift}$ the frequency shift of the spin-torque oscillator produced by the magnetic field from the magnetic disk, $\Delta f$ the full-width at half maximum of an oscillation spectrum of the spin-torque oscillator, T a read signal period which corresponds to a time period required for reading one recording bit, Round(X) a function that expresses an integral number closest to a given number X and is replaced by an integral number closest to the given number X in Equation 1, and G a constant greater than the signal-to-noise ratio of a desired read output signal of the spin-torque oscillator.

2. The magnetic reproducing apparatus according to claim 1, wherein the recording bits are arranged on all of the tracks at regular intervals.

3. The magnetic reproducing apparatus according to claim 1, wherein the magnetic disk has a distance r from a center of the magnetic disk to a track which the spin-torque oscillator reads when reading data, and a recording bit pitch b on the track and is rotated at a rotational speed that satisfies the following equation:

$$N = \frac{1}{2\pi}\frac{b}{T}\frac{1}{r} \qquad (2)$$

where N indicates a rotational speed of the magnetic disk in Equation 2.

4. The magnetic reproducing apparatus according to of claim 1, wherein a signal-to-noise ratio of the read output signal is set higher than 11 dB.

5. The magnetic reproducing apparatus according to claim 1, wherein the read signal period T and the frequency shift $\Delta\omega_{shift}$ satisfy the following equation:

$$|\Delta\omega_{shift}T - \pi| < \frac{\pi}{2}. \qquad (3)$$

6. The magnetic reproducing apparatus according to claim 1, wherein the oscillation frequency $\omega_o$ and the frequency shift $\Delta\omega_{shift}$ satisfy the following equation:

$$\omega_0 = \frac{n}{1}\Delta\omega_{shift} \qquad (4)$$

where n and 1 are positive integers.

7. The magnetic reproducing apparatus according to claim 1, wherein the magnetic disk has a plurality of zones each configured by a set of tracks, the tracks are divided for respective zones and the rotational speed is determined for each zone.

* * * * *